United States Patent
Trevisiol et al.

(10) Patent No.: US 10,694,648 B2
(45) Date of Patent: Jun. 23, 2020

(54) SYSTEM FOR INSERTING PINS INTO AN ARTICLE

(71) Applicants: Korvis LLC, Corvallis, OR (US); Korvis Automation (Shanghai) Co. Ltd, Shanghai (CN)

(72) Inventors: Mark Trevisiol, Corvallis, OR (US); Barry Johnson, Corvallis, OR (US); Yi Qiang Yang, Shanghai (CN)

(73) Assignees: KORVIS LLC, Corvallis, OR (US); KORVIS AUTOMATION (SHANGHAI) CO. LTD., Shanghai (CN)

( * ) Notice: Subject to any disclaimer, the term of this patent is extended or adjusted under 35 U.S.C. 154(b) by 212 days.

(21) Appl. No.: 15/711,450

(22) Filed: Sep. 21, 2017

(65) Prior Publication Data
US 2018/0199477 A1    Jul. 12, 2018

Related U.S. Application Data

(60) Provisional application No. 62/443,156, filed on Jan. 6, 2017.

(51) Int. Cl.
*B23P 19/00* (2006.01)
*H05K 13/04* (2006.01)

(52) U.S. Cl.
CPC ......... *H05K 13/0413* (2013.01); *H05K 13/04* (2013.01)

(58) Field of Classification Search
CPC ............... H05K 13/0015; H05K 13/04; H05K 13/0408; H05K 13/0413; H05K 13/046
See application file for complete search history.

(56) References Cited

U.S. PATENT DOCUMENTS

| | | | | |
|---|---|---|---|---|
| 5,526,974 A | * | 6/1996 | Gordon | H05K 3/303 228/103 |
| 5,903,662 A | | 5/1999 | DeCarlo | |
| 9,265,186 B2 | | 2/2016 | Nguyen | |
| 2002/0195058 A1 | * | 12/2002 | Choi | H01L 21/67109 118/728 |
| 2003/0178145 A1 | * | 9/2003 | Anderson | C23C 16/4586 156/345.51 |

FOREIGN PATENT DOCUMENTS

EP    2 989 871    3/2016

* cited by examiner

*Primary Examiner* — Paul D Kim
(74) *Attorney, Agent, or Firm* — Wenderoth, Lind & Ponack, L.L.P.

(57) ABSTRACT

A system places a pin into at least one hole on an article. The system generally includes a moveable base on which the article is located, a press head for holding and inserting the pin into the hole, a first vision system to capture a first image of a designated hole on the article, and a second vision system to capture second and third images of the held pin relative to the press head respectively from two vantage points. A computing unit is configured to assign a relative coordinate consisting of a X-value and a Y-value being correspondingly indicative to an actual location of the hole, compute relative deviations presented between the held pin and the designated hole, and move the base to adjust the article in a manner correcting or compensating for the computed deviation prior to inserting the held pin into the hole.

13 Claims, 10 Drawing Sheets

SYSTEM FOR INSERTING PINS INTO AN ARTICLE

CROSS REFERENCE TO RELATED APPLICATIONS

The present application claims priority to U.S. Provisional Patent Application No. 62/443,156 filed Jan. 6, 2017, entitled "Methods for Positioning and Fastening Pins On An Article And Systems Using the Same", the entire disclosure of which is hereby incorporated by reference in its entirety.

TECHNICAL FIELD

The present disclosure relates to an object placement system capable of placing or inserting an object onto or into an article with improved accuracy. Particularly, the disclosed system possesses multiple modules to determine potential deviation that exists between the article and the object and subsequently recompenses or corrects the determined deviation before placing or inserting the object.

BACKGROUND

In the constant bid to produce slimmer and lighter electronic devices with higher computing power such as mobile phones and laptops, more electronic components have to be crammed into the ever smaller space within the chassis of the devices. In response to the attempt to make more space for essential electronic components and reduce the overall weight of the final product, other less critical elements such as screw, pin and the like used for assembling the devices are progressively fabricated in a much smaller or miniaturized form factors such that the task to assemble these elements manually has become more difficult and time-consuming. To attain greater output and effective manufacturing process, automated systems or machines have been developed and employed in the assembly line of these electronic devices to expedite the production. The automated assembling system will generally place electronic components on top of a chassis succeeded by the action to fix or attach the components using one or more miniaturized pins. To ensure correct placement of the components, these assembling systems preferably possess one or more module equipped to examine and offset deviations presented in the components before placing the components. For example, U.S. Pat. No. 5,903,662 offers an automated placement apparatus having an alignment module designed for obtaining a first image of the component held by the placement head and a second image with respect to the placement site, the alignment module includes an image processor to analyze the first and second images to generate a control signal representative of a relative position error and an actuator receives the control signal to move the placement head and the placement site to correct the position error. Another similar system is disclosed in U.S. Pat. No. 9,265,186 in which the images acquired are superimposed for determining the relative deviation of the components and the placement site. Still, the like system using superimposed images to compute the position deviation is disclosed in European patent publication no. 2989871. However, there are other major challenges with respect to the use of the automated assembling systems. Particularly, insertion of the fastening pin into the apertures or holes prepared on the components or chassis can be extremely difficult that a deviation in micro scale will be sufficient to result in damaged product. Furthermore, incomplete or partial insertion of these fastening pins may undesirably expose part of the pin on a surface causing the manufactured product deemed defective. Still, none of the aforesaid references are able to address potential issues arisen in association to the faulty inserted pin. Therefore, any effort to improve automated assembling machine at such aspect will be greatly desired.

SUMMARY

One object of the present disclosure is directed to provide an automated assembling system having at least a module capable of placing and/or inserting at least one object onto or into an article. The object can be pin or the like.

Another object of the present disclosure is to provide an automated assembling system for placing and/or inserting at least one object onto or into an article with improve accuracy by analyzing images captured for the placement site and/or the object held by a press head in the disclosed system. Preferably, the images captured are free from superimposing on each other in computing the relative error or deviation between the held object and the placement site.

Further object of the present disclosure is to offer an automated assembling system for placing and/or inserting at least one object onto or into an article equipped with at least one module designed to detect and determine relative height, length or distance difference of the placed object and the surface of the article adjacent to the placed object at an axis perpendicular to the surface of the article.

At least one of the preceding objects is met, in whole or in part, by the present disclosure, in which one of the aspects of the present disclosure refers a system for placement of a pin, which comprises a pin head and a pin body, into at least one hole fabricated on an article. Particularly, the disclosed system comprises a moveable base on which the article having a surface carrying the hole is located; a press head for holding the pin and inserting the held pin into the hole on the article; a first camera or vision system installed to capture a first image illustrating planar arrangement of a discrete hole on the article; a second camera or vision system installed with an optical assembly to capture a second image and a third image capable of illustrating center axis of the held pin in relation to the center axis of the press head respectively from two vantage points which are substantially perpendicular to one another at the vertical plane; and a computing unit in consistent electrical communication and/or connection with at least one of the base, the press head, the first and second cameras or vision systems, and the optical assembly. Specifically, the computing unit is configured to assign a relative coordinate consisting of a X-value and a Y-value being correspondingly indicative to an actual location of the hole at a X-axis and a Y-axis on the surface, compute relative deviations presented between the held pin and the discrete hole at the X-axis and the Y-axis, and move the base to adjust the article in a manner correcting or compensating the computed deviation prior to inserting the held pin into the hole. Preferably, the relative deviation at the X-axis is computed by way of calculating an offset of the hole and an offset of the pin at the X-axis, and the relative deviation at the Y-axis is computed by way of calculating an offset of the hole and an offset of the pin at the Y-axis.

According to a plurality of embodiments, the offset of the hole at the X-axis is calculated by determining the number of pixel, preferably within the shortest possible distance or the distance with minimal pixels count, in the first image spacing between a center of the hole and a center of the first image along the X-axis and each pixel in the first image corresponds to a predetermined unit of length.

For some embodiments, the offset of the hole at the Y-axis is calculated by determining the number of pixel, preferably within the shortest possible distance in a presumed straight line, in the first image spacing between a center of the hole and a center of the first image along the Y-axis and each pixel in the first image corresponds to a known unit of length.

In accordance with several embodiments, the offset of the pin at the X-axis is calculated by determining distance spacing between a center axis of the pin held by the press head and a predetermined center axis of the press head in the second image.

Still, in more embodiments, the offset of the pin at the Y-axis is calculated by determining distance spacing between a center axis of the pin held by the press head and a center line predetermined or center axis of the press in the third image.

In several embodiments, the distance is determined by identifying the number of pixel spacing between the center axes of the held pin body and the press head.

In more embodiments, the system includes a feeding module capable of delivering pin of a predetermined orientation to be picked up by the press head. Particularly, the feeding module processes the stored pins such that at least one of the pins will be turned or flipped into the predetermined orientation eligible for the picking action carried out by the press head.

More embodiments of the disclosed system may further comprise a laser sensor or optical sensor capable of emitting a laser beam for measuring relative distance of one or more planar points on the surface of the article away from the laser sensor or optical sensor and the computing unit being configured to derive height of the pin head of an inserted pin in relation to the adjacent surface of the article through the laser sensor or optical sensor.

For a number of embodiments, the computing unit is further configured to determine distance of the center of the pin head of the discrete pin, sample N number of planar areas from the surface adjacent to the pin head, sample X number of planar points within and around the center of each sampled planar area, measure distance of each sample planar point, determine distance of each sampled planar area by averaging the measured distance of the sampled planar points within the planar area, average the determined distance of the sampled planar area, and derive the relative height of the pin head by computing the distance difference of the averaged distance of the sampled planar area and the distance of the center of the pin head. Preferably, the X and/or N is an integer not less than 2.

DETAILED DESCRIPTION

It is to be understood that the present invention may be embodied in other specific forms and is not limited to the sole embodiments described hereinafter. However modification and equivalents of the disclosed concepts such as those which readily occur to one skilled in the art are intended to be included within the scope of the claims which are appended thereto.

Figure 1:
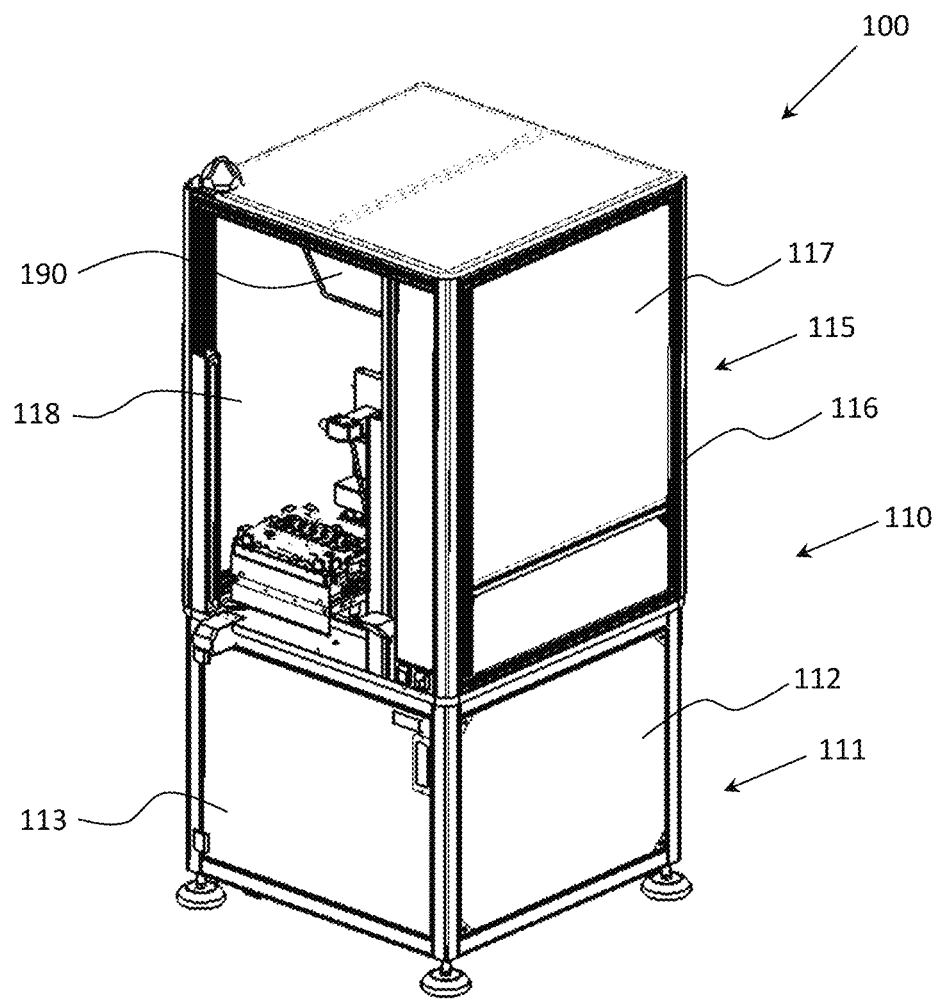
FIG. 1 shows perspective view of one embodiment of the disclosed system.

Referring to FIG. 1, a perspective view of one embodiment of a placement system 100 or an automated assembling system 100 with placement module set forth in the present disclosure is illustrated. The disclosed system 100 is directed for placement of a pin 193, which comprises a pin head 194 and a pin body 195, into at least one hole 196 fabricated on an article 197. As shown in schematic diagram of FIG. 2, the disclosed system 100 or the placement module of the system 100 comprises a moveable base on which the article 197 having a surface carrying the hole 196 is located; a press head 130 for holding the pin 193 and inserting the held pin 193 into the hole 196 on the article 197; a first camera or vision system 140 installed to capture a first image 181 illustrating planar arrangement of a designated hole 196 on the article 197; a second camera or vision system 150 installed with an optical assembly to capture a second image 182 and a third image 183 capable of illustrating lengthwise arrangement of the held pin 193 in relation to the press head 130 respectively from two vantage points which are substantially perpendicular to one another at the vertical plane; a computing unit being configured to assign a relative coordinate consisting of a X-value and a Y-value being correspondingly indicative to actual locations of the hole 196 at a X-axis and a Y-axis on the surface, compute relative deviations presented between the held pin 193 and the designated hole 196 at the X-axis and the Y-axis, and move the base to adjust the article 197 in a manner correcting or compensating the computed deviation prior to inserting the held pin 193 into the hole 196. Particularly, the relative deviation at the X-axis is computed by way of calculating an offset of the hole 196 and an offset of the pin 193 at the X-axis and the relative deviation at the Y-axis is computed by way of calculating an offset of the hole 196 and an offset of the pin 193 at the Y-axis. The relative coordinates are preferably recorded in a machine readable format providing relative position and distance of the holes 196 on the article 197 surface. The relative coordinates may be subjected to succeeding computation in different steps of the present disclosure to correlate with the press head 130, the first camera or vision system 140 and other relevant parts to the real world location or actual coordinate of the holes 196 for realizing the exact placement of the pin 193.

In more specific, the system 100 may include a housing in which all other components or modules, but not limited to, are preferably kept and installed to carry out the placement process. The housing 110 can be divided into upper compartment 115 and a lower compartment 111. The lower compartment 111 is fully encompassed by a top, a bottom and sidewalls 112 fabricated from metal or alloy materials with at least acceptable heat transmission property. One of the sidewalls of the lower compartment preferably carries a hinged door 113 opening of which allows unhindered access to the space enclosed within the lower compartment 111. Preferably, the disclosed system 100 keeps the computing unit in the lower compartment 111. One or more communication module may be disposed inside the lower compartment 111 for interfacing with the computing unit to facilitate real-time communication among the computing unit and other components installed to the disclosed system 100. The disclosed system 100 has the upper compartment 115 erected immediately on top of the lower compartment 111 that the top of the lower compartment 111 becomes the floor of the upper compartment 115 supporting anchorage or positioning of other modules like the press head 130, moveable base, cameras or vision systems, etc. Generally, the upper compartment 115 has a metal frame 116 composed of interconnecting jambs and headers defining multiple planar spaces on which at least a planar sheet 117 mounts to form the sidewalls of the upper compartment. At least one of the planar sheets 117 engaged with the frame 116 is made of transparent material such as glass or acrylic plastic that activities or actions performed within the upper compartment can be observed or examined by the user directly without the need to actually open up the upper compartment 115. In few preferred embodiments, the sidewalls and the top of the upper compartment are all fabricated using light permeable transparent materials. Like the lower compartment 111, the upper compartment 115 has at least one of the sidewalls 118 hingeably openable for the user to access the component or module installed therein.

Figure 2:
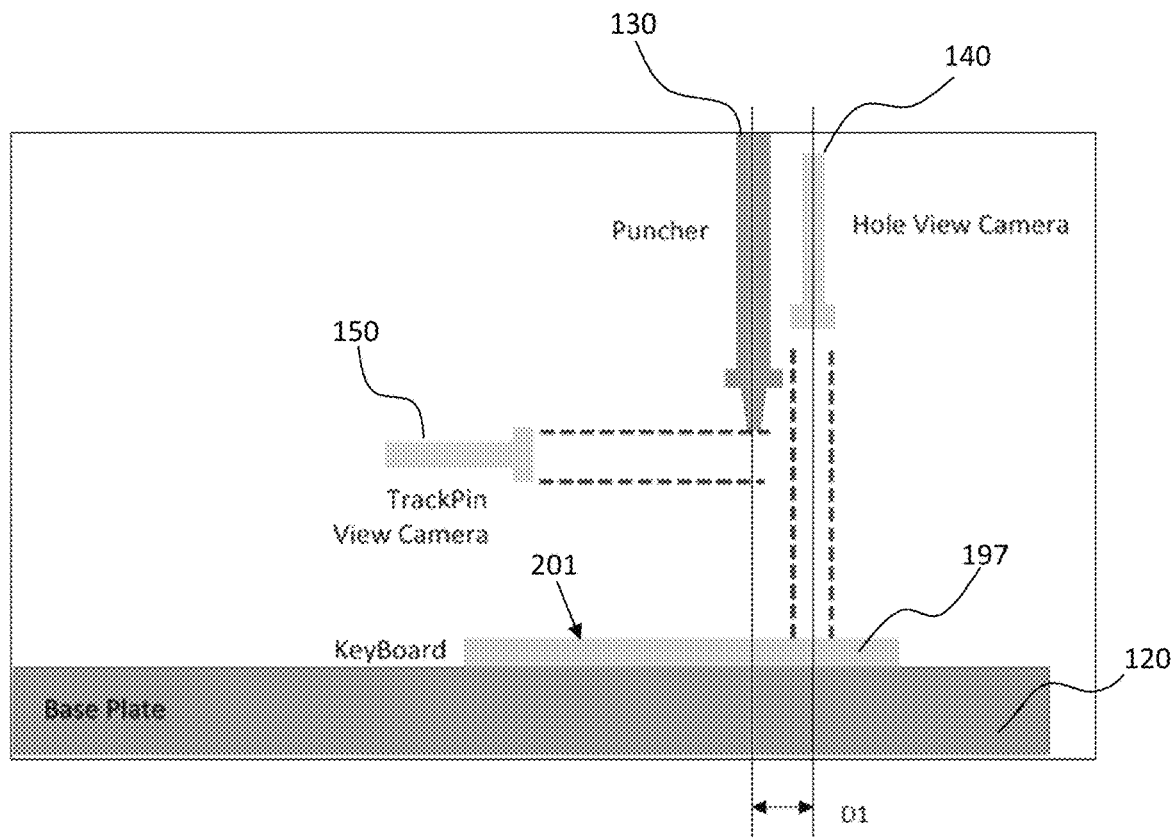
FIG. 2 is a schematic diagram showing one possible relative arrangement of the cameras or vision systems, press head and the moveable base of the disclosed system.
Figure 3:
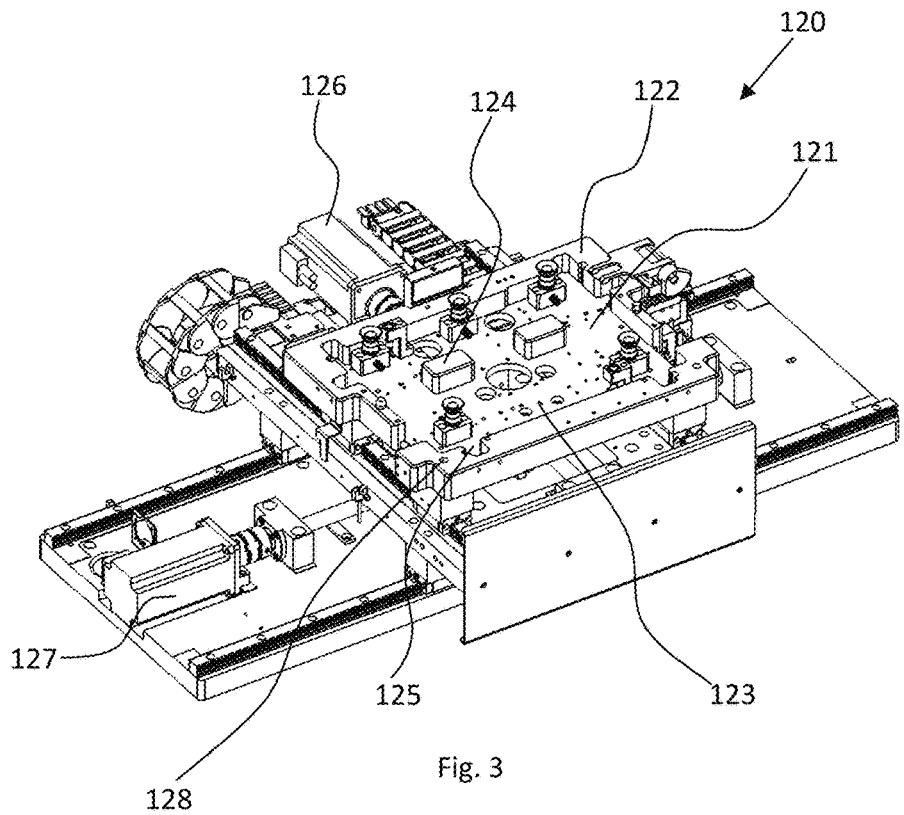
FIG. 3 illustrates one embodiment of the moveable base with a carved central region for fitting the article therein.

With reference to FIG. 2, the moveable base 120 is a slab-like structure laid on top of the floor of the upper compartment 115. The moveable base 120 is preferably built from a strong metal such as steel or stainless steel to attain enhanced service life span. The top surface of the moveable base 120 may possess one or more fastening members to secure the article 197 positioned thereon. In some embodiments, the fastening members can be tension clips clamping the article 197 to the top surface of the moveable base 120. As illustrated in FIG. 3, the top surface of the moveable base 120 may carry a depressed area 121 defining a shape or configuration for the article 197 to fit in. The raised edges 122 along the depressed area 121 impedes any unintentional lateral sliding of the laid article 197 thus ensuring proper securement of the kept article 197 therein throughout the placement process. The article 197 rested in the depressed area 121 may not be substantially in touch with the surface 123 of the moveable base 120 but instead being spaced slightly away overhanging above the surface 123 of the depressed area 121 via a pair of raising stands 124. A plurality of cut-out 125 may laterally extend out from depressed area 121 in some embodiments. These cut-outs 125 give additional space around the depressed area 121 for lifting the article 197 such as keyboards and/or chassis of a laptop manually or by other lifting tools. The underside or sides of the moveable base 120 may be coupled to one or more motors 126, 127. The motors 126, 127 actuate the X-axis and Y-axis movement of the base 120 in relation to the press head 130 to offset the computed relative deviation. The X-axis and Y-axis are two axes perpendicular to one another at the horizontal plane. For several embodiments, the moveable base 120 is detachable from the motors 126, 127 thus replaceable. Moveable base 120 with depressed area 121 of different size or shape can be exchangeable in these embodiments. Moreover, the moveable base 120 bears one or more apertures or markings 128 at the corner serving as the fiducial marks for the calibration of the disclosed system 100 prior to the placement operation.

It is important to note that the degree or fineness of adjustment attainable to offset the deviation by the presently disclosed system 100 largely depends upon the finest moveable distance achievable by the employed motors 126, 127.

Figure 4:
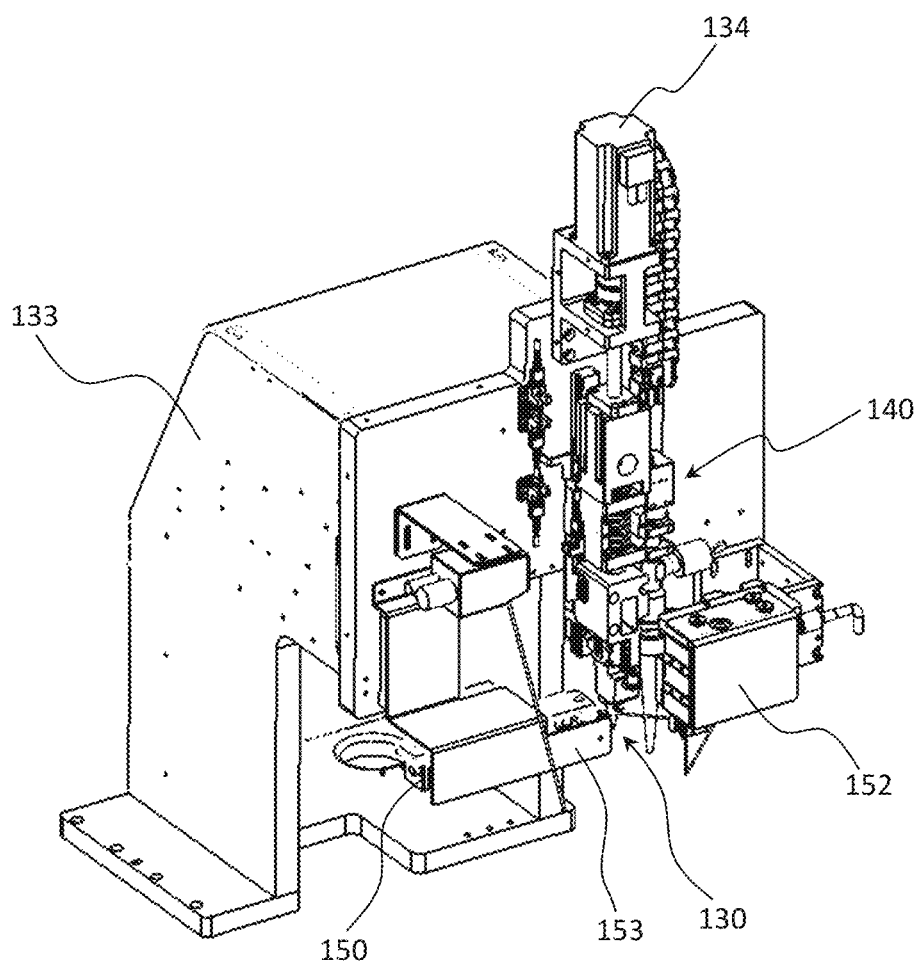
FIG. 4 shows the pick-head and the first camera or vision system anchored to the rigid construct in one embodiment of the disclosed system.

Pursuant to other embodiments, the press head 130 of the disclosed system 100 can be moved or shifted between a first position and a second position poising respectively for picking up the pin 193 and inserting or punching the picked pin 193 into the article 197, which can be a keyboard, a chassis and the like. FIG. 4 shows one embodiment of the press head 130 mounting on a solid platform 133 together with a press motor 134 actuating the vertical movement of the press head 130 for placement and picking of the pins 193. A secondary motor (not shown) or mechanism may be implemented in the disclosed system 100 to rotate or shift the press head 130 from the first position to the second position and vice versa. The platform 133 on which the press head 130 has mounted overhangs the press head 130 above the moveable base 120 or the article 197 fitted to the moveable base 120. For some embodiments, the degree of force and/or the moving distance of the press head 130 are controllable through a user interface or control panel interfacing with the computing unit. Commands and/or physical properties of both article 197 and objects can be provided to the computing unit to facilitate the placement action in the disclosed system 100. Preferably, the press head 130 is able to generate sufficient vacuum suction force at the pick tip 131 to lift the orientated pin 193 out from the feeding module 160. The press head 130 connects to one or more vacuum pump in such embodiments to adaptably exert the suction force. Likewise, the amount of suction force generated can be varied in response to the dimension and weight of the object or pin 193.

As presented in FIG. 4, the disclosed system 100 has the first camera or vision system 140, a lighting member 153 and an optical assembly 152 mounted alongside with press head 130 on the platform. As setting forth in the foregoing description, the first camera or vision 140 is set to capture the first image 181 pertaining planar view of a targeted hole 196 fabricated on the article 197. In a number of embodiments, the first camera or vision system 140 is positioned next to the press head 130. Being adjacent to the press head 130, the first camera or vision system 140 or at least the image sensor of the first camera or vision system 140 may not be aligned with the targeted hole 196 along the vertical plane. Therefore, the lighting member 153 and the optical assembly 152 are incorporated thereto to realize the capture of the first image 181. Particularly, the lighting member 153 provides sufficient illumination to the targeted hole 196. The optical assembly 152 is being arranged in fashion capable to collect part of the lights reflected from the surface of the article 197 around the targeted hole 196 and deflect the collected light to the first camera or vision system 140 for forming the first image 181. The position of the first camera or vision system 140, the lighting member 153 and the optical assembly 152 are adjustable in relation to the article 197 or the press head 130 in some embodiments, but preferably remains stationary throughout the placement process.

Figure 5:
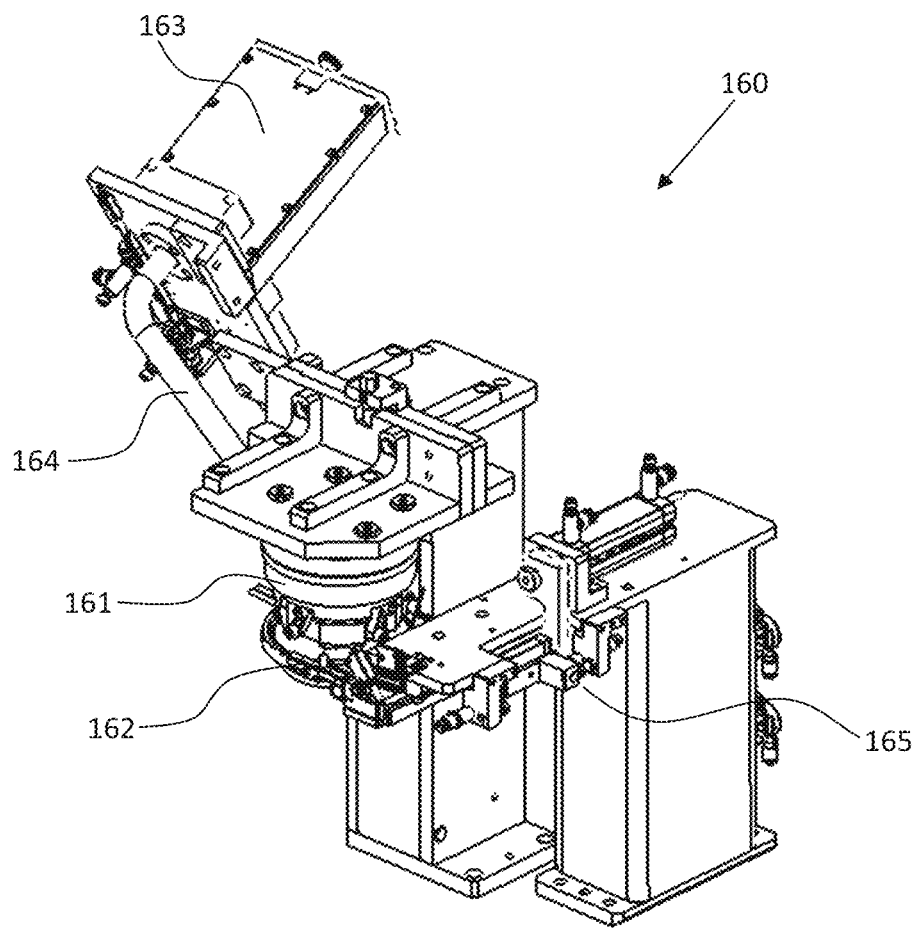
FIG. 5 illustrates one embodiments of the pin feeding module in the disclosed system responsible to supply constant feed to the pick-head and orientate the fed pin in the correct configuration before being taken up by the press-head.

FIG. 5 depicts one embodiment of the feeding module 160 tasked to deliver constant supply of the objects or pins 193 to the press head 130. More specifically, the feeding module 160 comprises a bowl feeder 161 having a hollow top 162 for receiving a plurality of the pins 193 from a stock bin 163. The stock bin 163 storing the pins 193 occupies a position relatively higher than the feeder bowl 161 with a shutter valve connecting to one end of a chute 164. Another end of the chute terminates into the hollow top 162 of the feeder bowl 161. The pins 193 will flow from the stock bin 163 down into the feeder bowl 161 under the gravitational influence once the disclosed system 100 opens the shutter valve. The feeder bowl 161 is set to arrange the pins 193 into a single line-up by way of moving the pins 193 on a spiral conveyor. The conveyor spirals out and up of the feeder bowl 161. The track of the conveyor becomes progressively elevated and narrower until at a point which only single pin 193 can pass through the conveyor crossing into a connecting shuttle 165. More specifically, the extra pins 193 loaded concurrently on the conveyor will be slowly eased out of the upper track of the conveyor back into the lower track or the feeder bowl 161 again. At the shuttle 165, a linear vibrator 166 intersects with the path of the moving pins 193. The linear vibrator 166 agitates or repetitively shakes along the horizontal plane at a predetermined frequency in an attempt to flip, turn or orientate the pins 193 into the correct configuration or orientation before finally picking up by the press head 130. Through the conveyor and the linear vibrator 166, the feeding module 160 is enabled of delivering pin 193 of a predetermined orientation to be picked up by the press head 130.

After picking the pins 193 from the feeding module 160, the press head 130 switches back to the second position holding the pin 193 and poising for the placement of the held pin 193 into the hole 196. Adapting the second position exposes the press head 130 and the held pin 193 to the second camera or vision system 150, which is configured to capture the second 182 and third images 183 with respect to two different lateral views, each from a vantage point perpendicular to one another, of the press head 130 and the pin 193. The vantage points for the second 182 and third images 183 are referred as a main vantage point and a side vantage point separately hereinafter for brevity of the description. In a fashion similar to capturing the first image 181, the disclosed system 100 has a lighting member 153 devoted to illuminate the press head 130 and the held pin 193 and an optical assembly 152 for rendering the third image 183 on the sensor of the second camera or vision system 150. Particularly, the disclosed system 100 set the second camera or vision system 150 at a location corresponds to the main vantage point where the light reflected from both press head 130 and pin 193 will travel and then land on the sensor of the second camera or vision system to create the second image 182 thereof. The optical assembly 152 may be located at the main vantage point in some embodiments instead of the second camera or vision system 150, but it is manipulated in a way to deflect at least part of the reflected light about the second image 182 landed on it to at least part of the sensor of the second camera or vision system 150. Likewise, the same or a different optical assembly 152 can be arranged around the press head 130 at the side vantage point gathering partial of the light reflected and directing the gathered light to the second camera or vision system 150 to produce the third image 183 through the sensor of the second camera or vision system 150. For a number embodiments, the lighting member 153 and the optical assembly 152 used in conjunctions with the second camera or vision system 150 can be one or more sets additional to those being used concurrently with the first camera or vision system 140. Still, other embodiments of the disclosed system 100 may use only a single optical assembly 152 for collecting the reflected lights and directing the collected lights to the first 140 and second camera or vision system 150.

Figure 7:
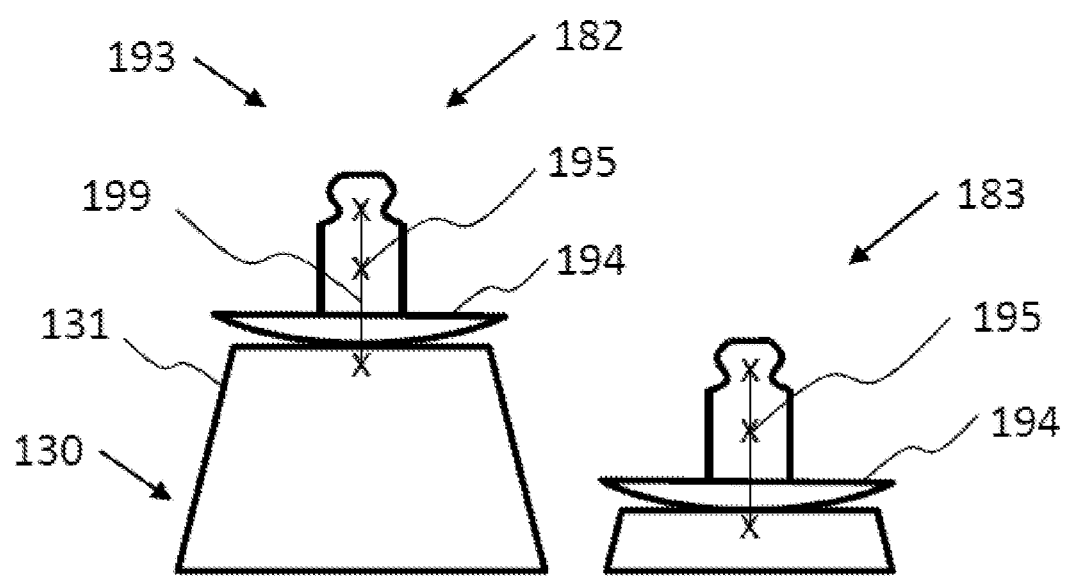
FIG. 7 present one example of the combined image of a second image and a third image showing alignment of the pin body in relation to a center axis of the press-head.

It is possible to divide the same sensor of the second camera or vision system 150 into two separate areas each of which individually receives the reflected lights indicative of the second 182 and third images 183. In these embodiments, the second camera or vision system 150 is able to simultaneously show the second 182 and third images 183 of two vantage points in a single combined image. The second image 182, third image 183 and/or the combined image are subsequently analyzed by the computing unit to compute and determine the deviation of the held pin 193 in relation to the hole 196 on the article 197. FIG. 7 shows one format of the combined image.

According to several embodiments of the present disclosure, the system 100 may undergo a sequential of calibrations and system 100 checks before working on the pin 193 or object placement. The disclosed system 100 properly aligns or adjusts the cameras or vision systems and press head 130 referring to the markings or calibration reference points for calibrating the system 100 and/or components. One of such calibration reference points is disposed on the moveable base 120 as mentioned in the foregoing. The calibration checks in the disclosed system 100 ensure the subsequent images capturing and deviation computing are always associated to a set of predetermined standard. For instance, the first camera or vision system 140 can be calibrated using one or more test matrices carrying a plurality of pre-disposed holes that the first camera or vision system 140 will be tasked to displace along the X-axis and Y-axis to find the center of each hole. Preferably, the first camera or vision system 140 finds and aligns the center of the first images 181 captured with the pre-disposed holes of the test matrices during the calibration step. Through the calibration steps run and the images acquired by the first camera or vision system 140, the disclosed system 100 is set to determine X-axis and the X-direction in the image produced by the first camera or vision system 140, determine Y-axis and the Y-direction in the image produced by the first camera or vision system 140, number of pixels per predefined distance in the image produced by the first camera or vision system 140 along the X-axis and/or Y-axis, and establish the corresponding relationship between the pixel in the image and the planar distance on the article 197 at the X-axis and Y-axis.

Similarly, the second camera or vision system 150 can be calibrated in the like manner using one or more test matrices along the Z-axis, the height or vertical axis. The test matrix of the second camera or vision system 150 can be composed of a plurality of pins 193 arranged in a predetermined fashion. The disclosed system 100 moves or displaces the second camera or vision system 150 along the Z-axis to the pin 193 position on the test matrix. The second camera or vision system 150 subsequently captures the relevant images of the pin 193 for identifying the center axis of the pin 193 in the acquired image. Based upon the images obtained, the disclosed system 100 preferably determines the angle between the Z-axis and the Z-direction of the image and establishes the corresponding relationship between the pixel in the image and the planar distance at the Z-axis.

As setting forth, the disclosed system 100 finds the location of the hole 196 on the article 197 based upon the relative coordinates of X-value and Y-value provided to and/or assigned by the computing unit. These values correlate to the location of the designated hole 196 in which the pin 193 will be inserted. The computing unit may preferably process these values further for the camera or vision system and/or the press head 130 to pinpoint the actual location or real world coordinates of the hole 196 on the article 197. For instance, the real world or actual coordinates of the hole 196 on the article 197 at the X-axis and Y-axis of the article 197's surface can be computed using the following equation 1 and 2:

Actual coordinate at X-axis=X-value−(cos($A1$)*X-value+sin($A1$)*X-value), where $A1$ is the angular displacement                                Equation 1

Actual coordinate at Y-axis=Y-value−(cos($A1$)*Y-value−sin($A1$)*Y-value), where $A1$ is the angular displacement.                             Equation 2

Figure 6:
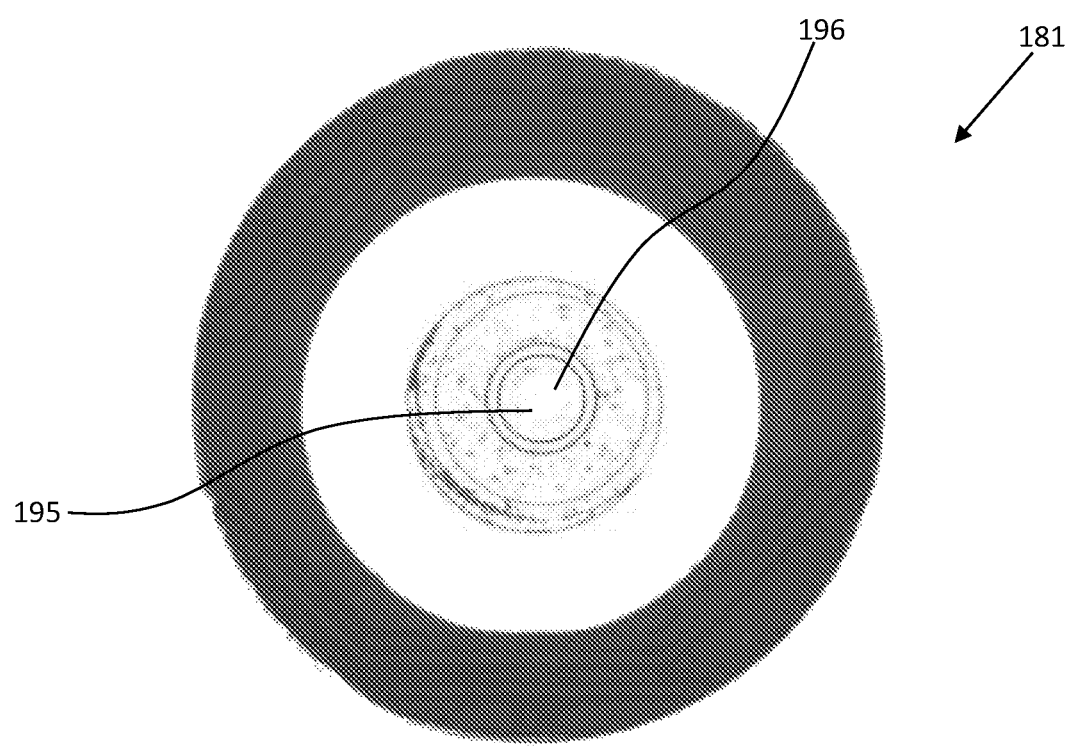
FIG. 6 presents one example of a first image capture showing planar view of the hole made on the surface of the article.

Location of the targeted hole 196 can be conveniently identified using the like equations. Once the real world location or coordinate is known, the disclosed system 100 displaces the moveable base 120 to situate the targeted hole 196 under and within the field of view of the first camera or vision system 140. The first camera or vision system 140 acquires the first image 181 of the targeted hole 196. The sample first images 181 taken by one embodiment of the present disclosure can be seen in FIG. 6. From the first image 181 acquired, the computing unit ascertains the center 195 of the hole 196 and the center of the first image 181. The center of the image can be considered as the fiducial mark or reference point for the disclosed system 100 to measure and decide whether the targeted hole 196 has deviated from the supposed position on the article 197 or not. In the situation where the center of the acquired first image 181 coincides with the center of the targeted hole 196, the disclosed system 100 or the computing unit recognizes that the targeted hole 196 is free from any offset or deviation from the desired positon thus taking no further action to derive the degree of offset for correcting the pin 193 placement. Otherwise, the computing unit concludes presence of the offset or deviation in the targeted hole 196 and proceeds to compute the degree of deviation or offset. Preferably, a center pixel is chosen from each of the center of the first image 181 and the center of the targeted hole 196 to be used for computing the number of pixels spanning therebetween. The disclosed system 100 records the relative and/or actual coordinates of these center pixels in some embodiments. Particularly, any offset or deviation of the targeted hole 196 at the X-axis is calculated by determining the number of pixel in the first image 181 spacing between a center 195 of the hole 196 and a center of the first image 181 along the X-axis and each pixel in the first image 181 corresponds to a predetermined unit of length. In the like manner, the offset of the hole 196 at the Y-axis is calculated by determining the number of pixel in the first image 181 spacing between a center 195 of the hole 196 and a center of the first image 181 along the Y-axis and each pixel in the first image 181 corresponds to a known unit of length. The required placement compensation for the targeted hole 196 along the X- and Y-axes can easily computed by multiplying the number of pixel differences with the predetermined unit of length per pixel. Nonetheless, the disclosed system 100 may employ other feasible approaches, and not limited to the aforesaid method, to generate the placement compensation needed for the targeted hole 196 without being restricted to the aforesaid approach.

In the meantime, the disclosed system 100 guides the second camera or vision system 150 to take the second 182 and third images 183 of the press head 130 and the pin 193 held thereto. FIG. 7 is an example of combined image generated by the computing unit having both second 182 and third images 183. The combined image may be presented on the display such that user of the system 100 can examine the relative arrangement or deviation of the pin 193 and the press head 130 manually in addition to the image analytic steps carried out through the computing unit. It is important to note that the second 182 and third images 183 are separately indicative of the pin 193 deviation along the X-axis and Y-axis in relation to the center axis 199 of the press head 130 or, more precisely, the tip 131 of the press head 130. As stated in the aforesaid, the disclosed system 100 may have the center axis 199 of the press head 130 determined during the calibration step. The deviation or offset of the held pin 193 can be acquired through computing the distance differences between the center axis of the held pin 193 and the center axis 199 of the press head 130 using the second 182 and third images 183 captured about the held pin 193. Particularly, the offset of the pin 193 at the X-axis is calculated by determining distance spacing between center axis of the pin 193 held by the press head 130 and a center axis 199 of the press head 130 in the second image 182. The center axis 199 of the press head 130 can be a predetermined center line of the press head 130. Similarly, the offset of the pin 193 at the Y-axis is calculated by determining distance spacing between a lengthwise center of the pin 193 held by the press head 130 and a center line predetermined in relation to the press head 130 in the third image 183. The distance deviated along the X-axis and/or the Y-axis can be computed resorting to the pixel number spacing between the two center axes. For instance, the distance can be determined by identifying the number of pixel spacing between a centerline of the pin body 195 held by the press head 130 and a center line predetermined in relation to the press head 130. Further embodiments may calculate the deviation or offset through fiducial marks applied to the images enabling the computing unit. It is important to note that the first, second and/or third captured images are analyzed individually by the computing unit following a set of predetermined instructions or criteria. The images captured by the disclosed system 100 are free from being superimposed onto one and other as offered in most of the relevant arts.

In accordance with more preferred embodiments, the disclosed system 100 further comprises a display 190 showing a user interface for the user to configure the system 100. The user interface may feature to show the captured images or real time video of the press head 130 and/or the targeted holes 196 allowing close examination of the pin 193 and hole 196. The display 190 is coupled with the computing unit via the communication module. At least parts of the computed analysis or readings are fed to the display 190 together with the images or video from the computing unit. Still, in other embodiments, the display 190 is touch-enabled to readily receive haptic input from the user directly for configuring the system 100 accordingly.

Pursuant to several embodiments, the disclosed system 100 may further include a height scanning module devoted to detect or determine height of the pin head 194 of the inserted pin 193 in relation to the adjacent planar surface of the article 197. Particularly, the disclosed system 100 or height scanning module comprises a laser sensor or optical sensor (not shown) capable of emitting a laser beam for measuring relative distance of one or more planar points on the surface 201 of the article 197 including the pin head 194 away from the laser sensor or optical sensor. Correspondingly, the computing unit is configured to derive the relative height of the pin head 194 of an inserted discrete pin 193 in relation to the adjacent surface 201 of the article 197 through the laser sensor or optical sensor using the measurements acquired via the laser sensor or optical sensor.

Figure 8A:
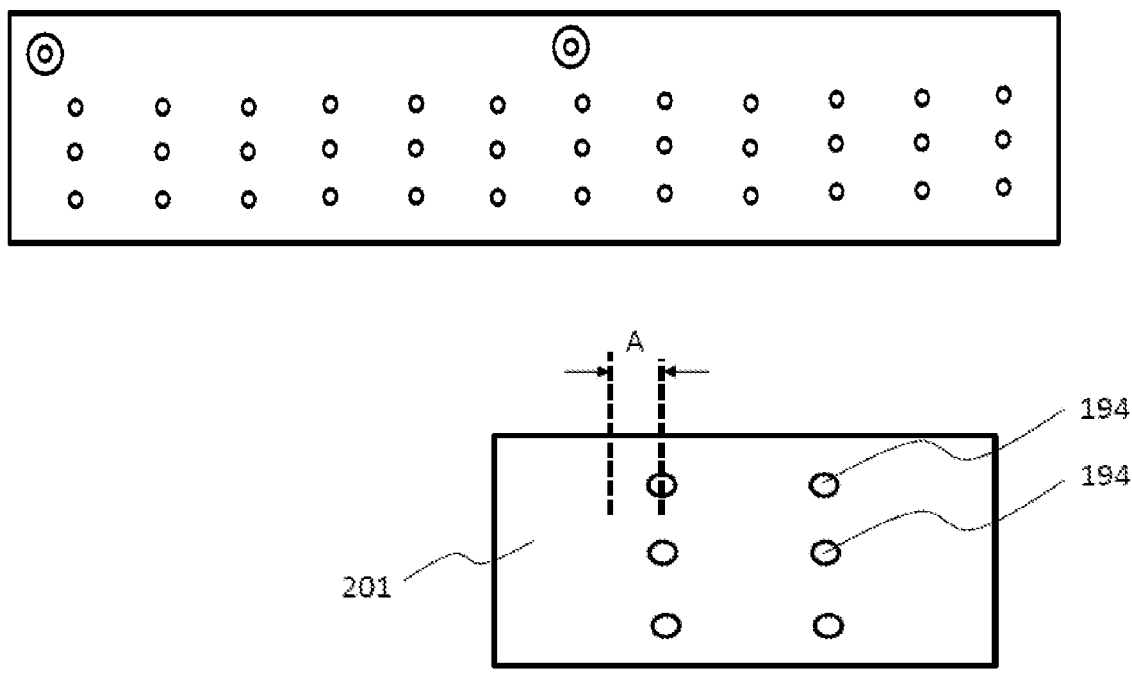
FIG. 8 shows (a) example image illustrating derivation of the central index of a designated hole on the article, (b) example image illustrating the possible planar areas sampled by the computing unit to read the distance between the sampled area and the laser sensor or optical sensor, (c) an image of the pin captured by the first camera or vision system on a discrete pin upon receiving illumination from a laser beam of a laser sensor or optical sensor that the captured image is used for determine averaged distance of a given area transverse to or spaced away from center of the pin head along the Y-axis as shown, and (d) an image of the pin captured by the first camera or vision system on a discrete pin upon receiving illumination from a laser beam of a laser sensor or optical sensor that the captured image is used for determine averaged distance of a given area spaced away from center of the pin head along the X-axis as shown.

For a plurality of embodiments, the height scanning module can utilize the first camera or vision system 140 for acquiring the image of the pin head 194 and adjacent planar surface 201 for computing the relative height or distance thereto. Thus, the disclosed system 100 may run sequential calibration steps to offset the distance spacing between the center of the laser beamed out from the laser sensor or optical sensor and the center of the first camera or vision system 140 (center of the image captured by the first camera or vision system). The calibration of the first camera or vision system 140 for the height scanning module can be performed in a manner similar to or substantially similar to the calibration step administrated for the placement module. For few embodiments, the calibration steps for the laser center include knowing a B number of data points, detect a basic reading value for all B number of data points, determine index of the data points with reading value exceeding a standard value, average the index to find the center index, compare the center index with a range of threshold and complete the calibration as long the center index is within the range of threshold or shift the moveable base 120 until the obtained center index is within the range of threshold. The center index may serve as the referral value to correctly align the laser sensor or optical sensor with the targeted pin head 194 and/or the adjacent planar surfaces 201 before taking the relative height measurement. The computing unit can determine the tolerance of the resolution between the diameter of the imaged and actual pin head 194 and further calibration may be required if the tolerance exceeds the acceptable level. Before proceeding to measure the relative height, the resolutions, pitch or the minimal displaceable distances of the laser sensor or optical sensor along the X-axis and the Y-axis in relation to the article 197 or pin head 194 have to be identified or known. For example, the pitches or resolutions along the X-axis and Y-axis for a targeted hole 196 shown in FIG. 8a are respectively 0.0175 mm and 0.02 mm with distance A being 2 mm. The computed center index along the X-axis for the laser sensor or optical sensor to align with the pin head 194 is 2 mm/0.0175 mm substantially corresponding to 114. The center index for the Y-axis can be generated according to the same manner in some embodiments. In the example shown in FIG. 8a, the center index for the target pin head 194 is set to (114, 150).

Figure 8B:
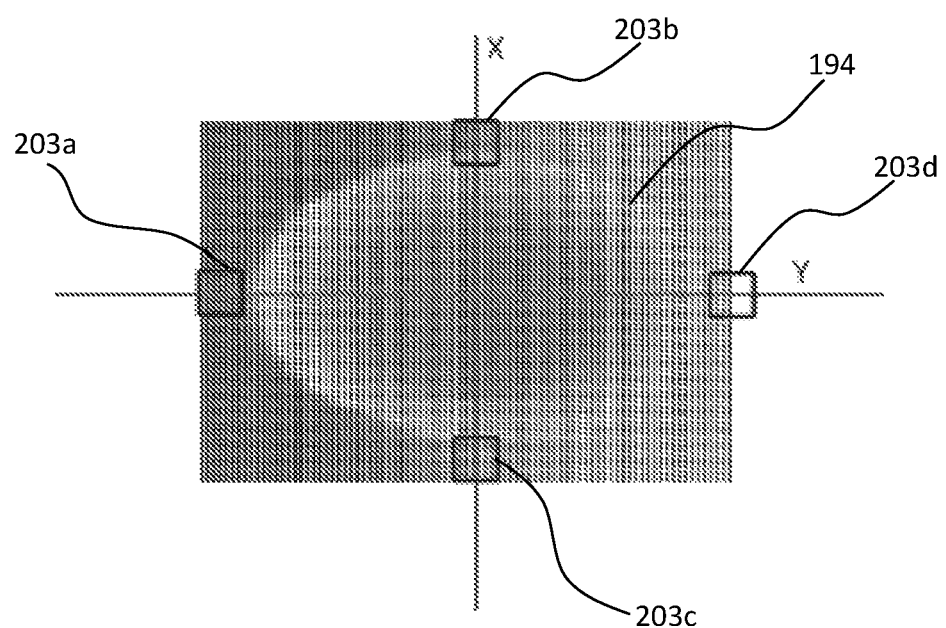
Figure 8C:
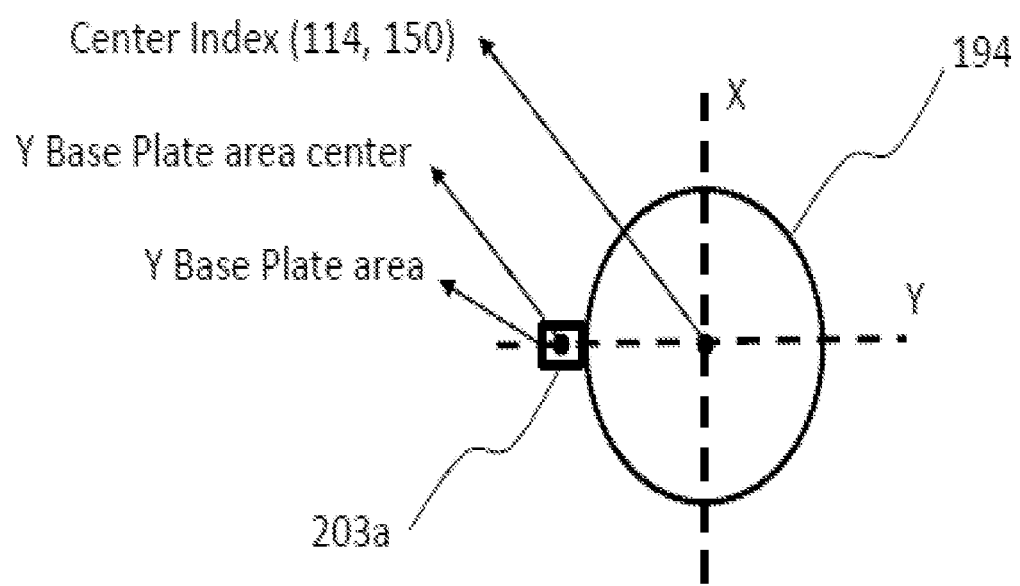

Based upon the acquired center index, the height scanning module with the assistance of the computing unit selects a defined area on the pin head 194 centralizing around the computed center index. Multiple readings about the relative distance of the pin head 194 within the defined area in relation to the laser sensor or optical sensor are acquired and averaged to finally generate a more precise read taken as the distance of the center of the pin head 194. In the meantime, the computing unit is configured to sample also N number of planar areas 203 from the surface of the article 197 adjacent to the pin head 194. FIG. 8b shows an image depicting four planar areas 203a-d that can be potentially sampled by the computing unit to identify the distance of these sampled planar areas 203a-d in relation to the laser sensor or optical sensor. For sampling from the lateral section adjacent to the pin head 194 as presented in FIG. 8c, the disclosed system 100 first needs to determine the center index at X-axis and Y-axis of the interested area or section, which is the section position immediately lateral to the pin head 194. In more particular, the X-axis center index for the laser sensor or optical sensor aligning with the sampled lateral planar section is identical to the X-axis center index of the center of the pin head 194, or corresponds to 114 with reference to the example given above. Further, the center index of the sampled lateral area along the Y-axis equals to Y-axis center index of the center of the pin—actual distance of the center of the pin head 194 and the lateral area/resolution of the laser sensor or optical sensor along the Y-axis. Referring again the example mentioned above, the Y-center index of the lateral area is 50 when the Y-axis center index of the center of the pin 193 is 150 with the actual distance and the Y-axis resolution of laser sensor or optical sensor being 2 mm and 0.02 mm respectively. With the center index of the lateral section ascertained, the computing unit further defines the planar lateral area in which multiple readings are acquired and averaged to derive the distance of the sampled lateral planar area 203a spaced apart from the laser sensor or optical sensor. The relative height of the pin head 194 compared to the sampled lateral planar area 203a can be subsequently established by computing the distance difference of the averaged distance of the sampled lateral planar area 203a and the distance of the center of the pin head 194.

Figure 8D:
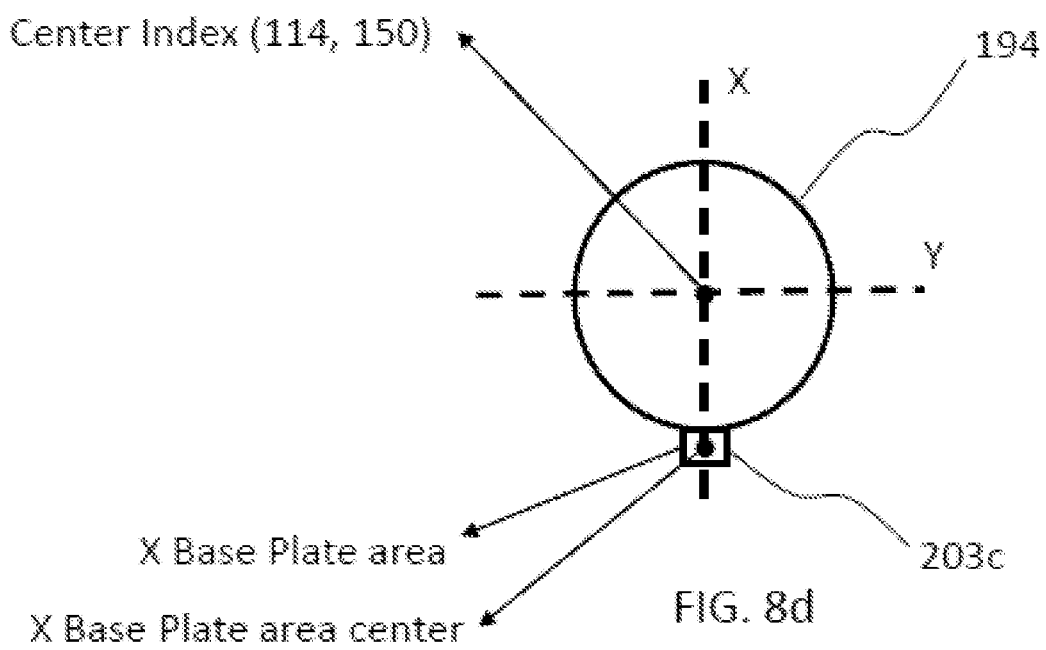

Further approach implemented in the present disclosure to sample the distance reading at the section below the pin head 194 is demonstrated herein using the above referred model with reference to FIG. 8d. Likewise, the center index at X-axis and Y-axis of the bottom section is determined first. Preferably, the center index at the Y-axis of the bottom section remains identical to the center of the pin head 194. The center index at the Y-axis of the bottom section is 150. On the contrary, the center index of the sampled bottom area along the X-axis has to be computed by summing the X-axis center index of the pin 193 and the fraction value, acquired by dividing the actual distance of the center of the pin head 194 and the bottom area via the resolution of the laser sensor or optical sensor along the X-axis). Referring again the example mentioned above, the X-center index of the bottom area is 228 when the X-axis center index of the pin head 194 is 114 with the actual distance and the Y-axis resolution of laser sensor or optical sensor being 2 mm and 0.0175 mm respectively. Having the center index of the bottom section established, the computing unit proceeds to define the planar bottom area in which multiple readings are acquired and averaged to derive the distance of the sampled bottom planar area 203c spaced apart from the laser sensor or optical sensor. The relative height of the pin head 194 compared to the sampled bottom planar area 203c is generated by computing the distance difference of the averaged distance of the sampled bottom planar area 203c and the distance of the center of the pin head 194. In short, the computing unit of the present disclosure is further configured to determine distance of the center of the pin head 194 of the discrete pin 193, sample N number of planar areas 203a-d from the surface adjacent to the pin head 194, sample P number of planar points within and around the center of each sampled planar area 203a-d, measure distance of each sample planar point, determine distance of each sampled planar area by averaging the measured distance of the sampled planar points within the planar area 203a-d, average the determined distance of the sampled planar area 203a-d, and derive the relative height of the pin head 194 by computing the distance difference of the averaged distance of the sampled planar area 203a-d and the distance of the center of the pin head 194. For few embodiments, the P and/or N is an integer not less than 2 for the disclosed system 100 to gain a more precise measurement or reading about the degree of projection of the pin head 194 in relative to the adjacent planar surface of the article 197 after the placement action.

Aspects of particular embodiments of the present disclosure address at least one aspect, problem, limitation, and/or disadvantage associated with existing automated assembling system or machine. While features, aspects, and/or advantages associated with certain embodiments have been described in the disclosure, other embodiments may also exhibit such features, aspects, and/or advantages, and not all embodiments need necessarily exhibit such features, aspects, and/or advantages to fall within the scope of the disclosure. It will be appreciated by a person of ordinary skill in the art that several of the above-disclosed structures, components, or alternatives thereof, can be desirably combined into alternative structures, components, and/or applications. In addition, various modifications, alterations, and/or improvements may be made to various embodiments that are disclosed by a person of ordinary skill in the art within the scope of the present disclosure, which is limited only by the following claims.

The invention claimed is:

1. A system for placement of a pin, which comprises a pin head and a pin body, into at least one hole fabricated on an article, the system comprising:
   a moveable base on which the article having a surface carrying the at least one hole is located;
   a press head for holding the pin and inserting the held pin into the at least one hole on the article;
   a first vision system installed to capture a first image illustrating planar arrangement of a designated hole on the article;
   a second vision system installed with an optical assembly to capture a second image and a third image capable of illustrating a center axis of the held pin in relation to a center axis of the press head respectively from two vantage points which are substantially perpendicular to one another at a vertical plane;
   a computing unit being configured to
      assign a relative coordinate consisting of a X-value and a Y-value being correspondingly indicative to an actual location of the at least one hole at a X-axis and a Y-axis on the surface,
      compute relative deviations presented between the held pin and the designated hole at the X-axis and the Y-axis, the relative deviation at the X-axis being computed by way of calculating an offset of the at least one hole and an offset of the pin at the X-axis, the relative deviation at the Y-axis being computed by way of calculating an offset of the at least one hole and an offset of the pin at the Y-axis, and
      move the base to adjust the article in a manner correcting or compensating the computed deviation prior to inserting the held pin into the at least one hole.

2. The system of claim 1, wherein the offset of the at least one hole at the X-axis is calculated by determining a number of pixels in the first image spacing between a center of the at least one hole and a center of the first image along the X-axis and each pixel in the first image corresponds to a predetermined unit of length.

3. The system of claim 1, wherein the offset of the at least one hole at the Y-axis is calculated by determining a number of pixels in the first image spacing between a center of the at least one hole and a center of the first image along the Y-axis and each pixel in the first image corresponds to a known unit of length.

4. The system of claim 1, wherein the offset of the pin at the X-axis is calculated by determining a distance spacing between a lengthwise center of the pin held by the press head and a center line predetermined in relation to the press head in the second image.

5. The system of claim 4, wherein the distance is determined by identifying a number of pixels spacing between a centerline of the pin body held by the press head and a center line predetermined in relation to the press head.

6. The system of claim 1, wherein the offset of the pin at the Y-axis is calculated by determining a distance spacing between a lengthwise center of the pin held by the press head and a center line predetermined in relation to the press head in the third image.

7. The system of claim 6, wherein the distance is determined by identifying a number of pixels spacing between a centerline of the pin body held by the press head and a center line predetermined in relation to the press head.

8. The system of claim 1, further comprising a display providing a user interface for configuring the system.

9. The system of claim 1, further comprising a feeding module capable of delivering a pin of a predetermined orientation to be picked up by the press head.

10. The system of claim 1, wherein the images captured are free from being superimposed one and other.

11. The system of claim 1, further comprising an optical sensor for measuring a relative distance of one or more planar points on the surface of the article away from the optical sensor,
   wherein the computing unit is configured to derive a relative height of the pin head of an inserted discrete pin in relation to an adjacent surface of the article through the optical sensor.

12. The system of claim 11, wherein the computing unit is further configured to determine a distance of a center of the pin head of the discrete pin, sample N number of planar areas from the surface adjacent to the pin head, sample P number of planar points within and around a center of each sampled planar area, measure a distance of each sample planar point, determine a distance of each sampled planar area by averaging the measured distances of the sampled planar points within the planar area, average the determined distances of the sampled planar areas, and derive the relative height of the pin head by computing a distance difference of the averaged distance of the sampled planar areas and the distance of the center of the pin head.

13. The system of claim 12, wherein the P and/or N is an integer not less than 2.

* * * * *